(12) United States Patent
Pritchard et al.

(10) Patent No.: US 7,730,435 B2
(45) Date of Patent: Jun. 1, 2010

(54) AUTOMATIC TEST COMPONENT GENERATION AND INCLUSION INTO SIMULATION TESTBENCH

(75) Inventors: Jeffrey Orion Pritchard, Santa Cruz, CA (US); Todd Wayne, Soquel, CA (US)

(73) Assignee: Altera Corporation, San Jose, CA (US)

( * ) Notice: Subject to any disclaimer, the term of this patent is extended or adjusted under 35 U.S.C. 154(b) by 340 days.

(21) Appl. No.: 11/799,238

(22) Filed: Apr. 30, 2007

(65) Prior Publication Data

US 2007/0234247 A1 Oct. 4, 2007

Related U.S. Application Data

(62) Division of application No. 10/869,174, filed on Jun. 15, 2004, now Pat. No. 7,225,416.

(51) Int. Cl.
*G06F 17/50* (2006.01)
(52) U.S. Cl. ............... 716/4; 716/5; 716/6; 703/13; 703/14; 703/15; 703/16
(58) Field of Classification Search .......... 716/4–6; 703/13–16
See application file for complete search history.

(56) References Cited

U.S. PATENT DOCUMENTS

| | | | |
|---|---|---|---|
| 4,495,599 A | | 1/1985 | Haag et al. |
| 5,162,728 A | * | 11/1992 | Huppenthal ............... 324/758 |
| 5,204,829 A | | 4/1993 | Lyu et al. |
| 5,282,213 A | | 1/1994 | Leigh et al. |
| 5,452,239 A | | 9/1995 | Dai et al. |
| 5,544,067 A | | 8/1996 | Rostoker et al. |
| 5,701,309 A | * | 12/1997 | Gearhardt et al. ........... 714/736 |
| 5,726,902 A | | 3/1998 | Mahmood et al. |
| 5,848,262 A | | 12/1998 | Burch |
| 6,026,226 A | | 2/2000 | Heile et al. |
| 6,026,230 A | * | 2/2000 | Lin et al. ............... 703/13 |
| 6,053,947 A | | 4/2000 | Parson |
| 6,067,650 A | | 5/2000 | Beausang et al. |
| 6,072,944 A | | 6/2000 | Robinson |
| 6,086,624 A | | 7/2000 | Murata |
| 6,110,223 A | | 8/2000 | Southgate et al. |
| 6,152,612 A | | 11/2000 | Liao et al. |
| 6,182,247 B1 | | 1/2001 | Hermann et al. |
| 6,247,147 B1 | | 6/2001 | Beenstra et al. |

(Continued)

OTHER PUBLICATIONS

Altera Corporation, *Simulating Nios Embedded Processor Designs*, Feb. 2003, ver. 2.1, Application Note 189, pp. 1-30.

(Continued)

*Primary Examiner*—Naum B Levin
(74) *Attorney, Agent, or Firm*—Weaver Austin Villeneuve & Sampson LLP (57) ABSTRACT

Methods and apparatus are provided for efficiently generating test components for testing and evaluating a design under test. As a design is being configured, generated test components are made available. In one example, test components are automatically generated and included in a simulation testbench based on selected components in the design. Generally, the test components complement the selected components in the design. Moreover, the test components can be automatically seeded with initial contents.

10 Claims, 6 Drawing Sheets

U.S. PATENT DOCUMENTS

| | | | |
|---|---|---|---|
| 6,247,165 B1 | 6/2001 | Wohl et al. | |
| 6,286,114 B1 | 9/2001 | Veenstra et al. | |
| 6,317,860 B1 | 11/2001 | Heile | |
| 6,389,558 B1 | 5/2002 | Hermann et al. | |
| 6,425,116 B1 | 7/2002 | Duboc et al. | |
| 6,460,148 B2 | 10/2002 | Veenstra et al. | |
| 6,530,073 B2 | 3/2003 | Morgan | |
| 6,539,536 B1 | 3/2003 | Singh et al. | |
| 6,588,004 B1 | 7/2003 | Southgate et al. | |
| 6,591,403 B1 * | 7/2003 | Bass et al. | 716/5 |
| 6,606,532 B1 | 8/2003 | Yasuura et al. | |
| 6,606,588 B1 * | 8/2003 | Schaumont et al. | 703/15 |
| 6,618,839 B1 | 9/2003 | Beardslee et al. | |
| 6,654,919 B1 | 11/2003 | Watkins | |
| 6,687,662 B1 | 2/2004 | McNamara et al. | |
| 6,701,474 B2 * | 3/2004 | Cooke et al. | 714/724 |
| 6,704,889 B2 | 3/2004 | Veenstra et al. | |
| 6,754,862 B1 | 6/2004 | Fairman et al. | |
| 6,823,497 B2 | 11/2004 | Schubert et al. | |
| 6,842,888 B2 | 1/2005 | Roberts | |
| 6,862,563 B1 | 3/2005 | Hakewill et al. | |
| 6,883,147 B1 | 4/2005 | Ballagh et al. | |
| 6,918,076 B2 | 7/2005 | Lagoon et al. | |
| 7,020,854 B2 | 3/2006 | Killian et al. | |
| 7,024,649 B2 | 4/2006 | Collmeyer et al. | |
| 7,036,046 B2 | 4/2006 | Rally et al. | |
| 7,062,427 B2 | 6/2006 | Walther et al. | |
| 7,072,813 B2 | 7/2006 | Bellemaz et al. | |
| 7,076,751 B1 | 7/2006 | Nixon et al. | |
| 7,076,753 B2 | 7/2006 | Cerny et al. | |
| 7,085,702 B1 | 8/2006 | Hwang et al. | |
| 7,089,517 B2 * | 8/2006 | Yamoto et al. | 716/5 |
| 7,107,567 B1 | 9/2006 | LeBlanc | |
| 7,110,935 B1 | 9/2006 | Hwang et al. | |
| 7,200,735 B2 | 4/2007 | Wang et al. | |
| 7,225,416 B1 | 5/2007 | Pritchard et al. | |
| 7,318,014 B1 | 1/2008 | Molson | |
| 2003/0033374 A1 | 2/2003 | Horn et al. | |
| 2003/0088710 A1 | 5/2003 | Sanhu et al. | |
| 2003/0154465 A1 | 8/2003 | Bollano et al. | |
| 2003/0182641 A1 | 9/2003 | Yang | |
| 2003/0200522 A1 | 10/2003 | Roberts | |
| 2003/0204388 A1 | 10/2003 | Rodriguez et al. | |
| 2003/0225560 A1 | 12/2003 | Garcia et al. | |
| 2005/0065990 A1 | 3/2005 | Allen | |
| 2006/0117274 A1 | 6/2006 | Tsing et al. | |

OTHER PUBLICATIONS

U.S. Appl. No. 10/405,836, Office Action mailed Jan. 18, 2008.
U.S. Appl. No. 10/405,836, Office Action mailed Jul. 5, 2006.
U.S. Appl. No. 10/405,836, Office Action mailed Jan. 31, 2007.
U.S. Appl. No. 10/405,836, Office Action mailed Jun. 18, 2007.
U.S. Appl. No. 10/458,516, Office Action mailed Aug. 24, 2006.
U.S. Appl. No. 10/458,516, Office Action mailed Mar. 3, 2006.
U.S. Appl. No. 10/458,516, Office Action mailed Sep. 26, 2007.
U.S. Appl. No. 10/458,516, Office Action mailed Nov. 21, 2007.
Mahlke, S. et al., *Bitwidth Cognizant Architecture Synthesis of Custom Hardware Accelerators*, IEEE, Aug. 30, 2001, 47 pages.
Holmberg, Per et al., *The Math Works and Xilnx take FPGAs into Mainstream DSP*, New Technologies DSP, Feb. 2001, pp. 14-15.
Kreiner, Christian et al., *A Novel Codesign Approach based on Distributed Virtual Machines*, Institute for Technical Informatics, Mar. 2002.
Chin, Darin, *Implementing DSP Designes with the Xilnx System Generator and Implementation Tools*, Jun. 2001, Syndicated, vol. 1, Issue 2, pp. 1-2.
Xilnx® *ChipScope Pro Software and Cores User Manual*, Apr. 10, 2002.
*Simulink: Dynamic System Simulation for MATLAB®*, Version 3, Jan. 1999.
*Formal Verification Flow for Xilinx Devices Using the Synplify; Pro® Software and the Conformal™ LEC Tool*, Mar. 2003, downloaded from http://www.synplicity.com/literature.
Carter, Grant, *System Level simulation of Digital Designs: A Case Study*, 1998.
Pelkonen et al., *System-Level Modeling of Dynamically Reconfigurable hardware with SystemC*, EE 2003.
Givargis et al, *Instruction-Based System-Level power Evaluation of System-on-a-Chip Peripheral Cores*, IEEE 2002.
Vink, *Programming DSPs using C: efficiency and portability trade-offs*, Embedded Systems, May 2000, pp. 19-30.
The Authoritative Dictionary of IEEE Standard Terms, 7th Edition © 2000, p. 915.
Synopsys® *SourceModel User's Manual for VHDL*, Apr. 1999, pp. 1-15 and 95-106.
Dong S. Ha, Professor, downloaded on Jun. 15, 2006 from http://www.ee.vt.edu/ha.
Graham, Paul et al., *Instrumenting Bitstreams for Debugging FPGA Circuits*, 2001 Proceedings of the 9th Annual IEEE Symposium on Field-Programmable Custom Computing Machines, ten unnumbered pages.

* cited by examiner

AUTOMATIC TEST COMPONENT GENERATION AND INCLUSION INTO SIMULATION TESTBENCH

This application is a divisional of U.S. patent application Ser. No. 10/869,174, filed Jun. 15, 2004 now U.S. Pat. No. 7,225,416 entitled "Methods and apparatus for automatic test component generation and inclusion into simulation testbench" from which priority under 35 USC 120 is claimed, and which is hereby incorporated by reference.

BACKGROUND OF THE INVENTION

1. Field of the Invention

The present invention relates to design automation tools for electronic devices. More specifically, the present invention relates to methods and apparatus for evaluating the device's design under test (DUT) by automatically generating test components and including them in a simulation testbench.

2. Description of the Prior Art

The increasing complexity of electronic devices has prompted logic designers to use a variety of design automation tools to assist in implementing a design on electronic devices such as programmable logic devices (PLDs), field programmable gate arrays (FPGAs), application specific integrated circuits (ASICs), digital signal processors (DSPs), and system-on-a-chip devices (SOCs). In one example, a simulation testbench is used to subject the design to a stimulus, such as a test component, whereby the design can be tested and evaluated for implementation.

However, the mechanisms for simulating a design having an on-device component (i.e., component located on the device) interacting with an off-device component (i.e., component located off the device) are limited. Generally, manual installation of an off-device test component in the simulation testbench is required. That is, a logic designer needs to either construct an off-device test component from scratch or obtain an already constructed off-device test component from a vendor. The test component is then manually wired to the design under test for stimulation. Before stimulation can begin, however, the logic designer is typically required to also manually configure and seed the test component with initial contents. Further, manual installation is required every time an off-device test component is needed to stimulate a DUT having an on-device component counterpart.

The manual installation of the off-device test component is often a tedious, time-consuming, and error prone task. It is therefore desirable to provide improved methods and apparatus for efficiently testing and evaluating designs that have on-device components interacting with off-device components.

SUMMARY OF THE INVENTION

Methods and apparatus are provided for efficiently generating test components for testing and evaluating a design under test. As a design is being configured, generated test components are made available. In one example, test components are automatically generated and included in a simulation testbench based on selected components in the design. Generally, the test components complement the selected components in the design. Moreover, the test components can be automatically seeded with initial contents.

In one aspect, the present invention provides a computerized method for evaluating a device's design under test having an on-device component. The method includes, in response to the on-device component, automatically generating a test component module that includes a representation of an off-device component. The off-device component is functionally complementary to that of the on-device component. The method also includes inserting the test component module into a simulation testbench for evaluating the device's design under test.

In one embodiment, the computerized method further includes generating a design under test module that includes a representation of the on-device component and coupling the design under test module to the test component module. The computerized method may further include: generating signals between the design under test module and the test component module to allow substantial evaluation of the device's design under test; or seeding the test component module with initial contents. Generating the design under test module includes receiving a profile for the design under test; and using the profile to construct the design under test module. Typically, the profile corresponds to a parameterization of the design under test by a user. The parameterization includes defining interfaces, data widths, and the type of signal for input and output lines associated with the design under test.

In another embodiment, generating the test component module includes receiving a profile for the design under test; and using the profile to construct the test component module. Yet, in another embodiment, the on-device component is selected from the group consisting of adders, phase lock loops, memory, video controllers, memory controllers, processors, and timers.

In another aspect, the present invention provides a method for generating a testbench to simulate a semiconductor chip's design under test. The method includes receiving information on a design under test having an on-chip component; and determining whether an off-chip test component module should be generated for integration into the testbench. The off-chip test component module includes a representation of an off-chip component that is functionally complementary to that of the on-chip component.

In one embodiment, when it is determined that the off-chip test component module should be generated, the method further includes generating the off-chip test component module; and integrating the off-chip test component module into the testbench. The method may further include generating a design under test module that includes a representation of the on-chip component; receiving information on a top-level simulation module; and coupling the off-chip test component module with the design under test module that is consistent with the top-level simulation module. Additionally, the method may include seeding the off-chip test component module with initial contents. Seeding the off-chip test component module includes receiving a seeding file that includes initial contents; and integrating the initial contents with the off-chip test component module. Yet, the method may further include instantiating a clock generator to couple a clock signal to the design under test module; and instantiating a reset generator to couple a rest signal to the design under test module. Typically, the testbench allows the off-chip test component module to communicate with the design under test module such that simulation of the semiconductor chip's design under test can occur.

In another aspect, the present invention provides a design automation tool for simulating a device's DUT having an on-chip component. The design automation tool includes a testbench generator for generating the DUT module and for generating an off-chip test component module. The testbench generator is further configured to couple the off-chip test component module to the DUT module for simulation.

In one embodiment, the design automation tool further includes a reset generator for coupling a reset signal to the DUT module; and a clock generator for coupling a clock signal to the DUT module. In another embodiment, coupling the off-chip test component module to the DUT module includes providing logic to align their respective inputs and outputs. The inputs and outputs include clock lines, control lines, and data lines.

In another aspect, the present invention provides a computer system for generating a testbench to simulate a semiconductor chip's design under test. The computer system includes memory; and a processor coupled to memory. The processor is configured for: receiving information on a design under test having an on-chip component; and determining whether an off-chip test component module should be generated for integration into the testbench. The off-chip test component module includes a representation of an off-chip component that is functionally complementary to that of the on-chip component.

In one embodiment, where it is determined that the off-chip test component module should be generated, the processor is further configured for: generating the off-chip test component module; and integrating the off-chip test component module into the testbench. The processor may be further configured for: generating a design under test module that includes a representation of the on-chip component; receiving information on a top-level simulation module; and coupling the off-chip test component module with the design under test module that is consistent with the top-level simulation module. Additionally, the processor may be further configured for seeding the off-chip test component module with initial contents; or instantiating a clock generator to couple a clock signal to the design under test module and instantiating a reset generator to couple a rest signal to the design under test module.

In another aspect, the present invention provides an apparatus for generating a testbench to simulate a semiconductor chip's design under test. The apparatus includes means for receiving information on a design under test having an on-chip component; and means for determining whether an off-chip test component module should be generated for integration into the testbench. The off-chip test component module includes a representation of an off-chip component that is functionally complementary to that of the on-chip component.

In one embodiment, where it is determined that the off-chip test component module should be generated, the apparatus further includes means for generating the off-chip test component module and means for integrating the off-chip test component module into the testbench. The apparatus may further include: means for generating a design under test module that includes a representation of the on-chip component; means for receiving information on a top-level simulation module; and means for coupling the off-chip test component module with the design under test module that is consistent with the top-level simulation module. Additionally, the apparatus may further include means for seeding the off-chip test component module with initial contents; or means for instantiating a clock generator to couple a clock signal to the design under test module and means for instantiating a reset generator to couple a rest signal to the design under test module.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. For example, the techniques of the present invention will be described in the context of particular design automation tools including tools for simulation.

However, it should be noted that the techniques of the present invention can be applied to a variety of tools and associated code provided to the tools. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Simulation is an important part of any design process. As a design develops and contains on-device components that may necessarily interact with corresponding off-device components, a technique in accordance with the present invention automatically generates test component modules that model the off-device components. The technique can also automatically include the off-device test component modules into a simulation testbench as well as prepare (e.g., seeding, interconnecting, etc.) them for simulation with the DUT. As such, the designer is able to easily simulate the DUT with the corresponding off-device test component in which code or data may be interchanged and their responses recorded for observation. Generally, the off-device test component modules are generated using the design profiles of the on-device components. In some cases, the generated test component modules for the off-device components can be configured to be reasonable functional models (e.g., non-timing exact but functionally correct). In other cases, they can be cycle accurate.

The increased complexity of microelectronic technology has motivated the development of design automation technology. Design automation involves the use of computer applications and tools to conduct portions of product design and manufacturing of devices such as Application-Specific Integrated Circuits (ASICs), programmable chips including programmable logic devices (PLDs) and field programmable gate arrays (FPGAs), as well as System on a Chip (SOCs) and System on a Programmable Chip (SOPCs) devices. The process of designing, verifying, fabricating, and testing electronic devices, particularly ASICs, is time-consuming and expensive. Any flaw uncovered on a particular ASIC after fabrication is complete requires a vast amount of time and expense to correct.

Care is taken to use a variety of effective design automation tools to aid in the efficient development of electronic devices. Any mechanism or tool used to implement an electronic design on an electronic device is referred to herein as a design automation tool. Design automation tools can be any electronic design automation (EDA) tool including synthesis, place-and-route, timing analysis, simulation, and other verification tools. Comprehensive simulation of the electronic DUT is often a difficult endeavor. In some cases, the electronic DUT includes on-device components that interact with corresponding off-device components. Conventionally, a set of test components that model the off-device components is manually installed to form a testbench for the DUT.

As mentioned earlier, there are several weaknesses to this approach. For example, manual installation of test components is time consuming and error prone. This is because in many instances, the test components are not readily available for integration into the simulation testbench. That is, whenever an off-device component for simulation is needed, the designer must either code individually a test component or obtain a completed one from a vendor. Afterwards, the designer is further required to couple the test component to the DUT by manually wiring them together. Furthermore, the laborious task of seeding the test components with the appropriate initial contents (established at simulation time 0) is often required. Techniques for efficiently generating the off-device test components and/or including them into the simulation testbench would be valuable.

The techniques of the present invention provide mechanisms for enabling designers to generate a test component module for inclusion into a simulation testbench. The test component module typically includes a representation of an off-device component that is functionally complementary to that of an on-device component within the DUT. In one example, the off-device test component module is identified for generation while the designer develops a design having on-device components. Upon selecting and/or profiling the on-device component for inclusion in the DUT, a corresponding off-device test component module is automatically generated using the profile of the on-device component. In addition, the off-device test component module may automatically be integrated into a simulation testbench of choice for evaluating the DUT and its associated components.

The general characteristics of each corresponding off-device test component module, such as pin count and design size, can be intelligently controlled with the profiles of the on-device components. A readily available testbench test component module representative of the off-device component, which complements the on-device component, can be generated with little effort. The techniques of the present invention generate off-device test component modules with realistic attributes and meaningful user assignments, resulting in a high probability in simulating "real world" conditions for the DUT and in providing good system integration testing.

Figure 1:
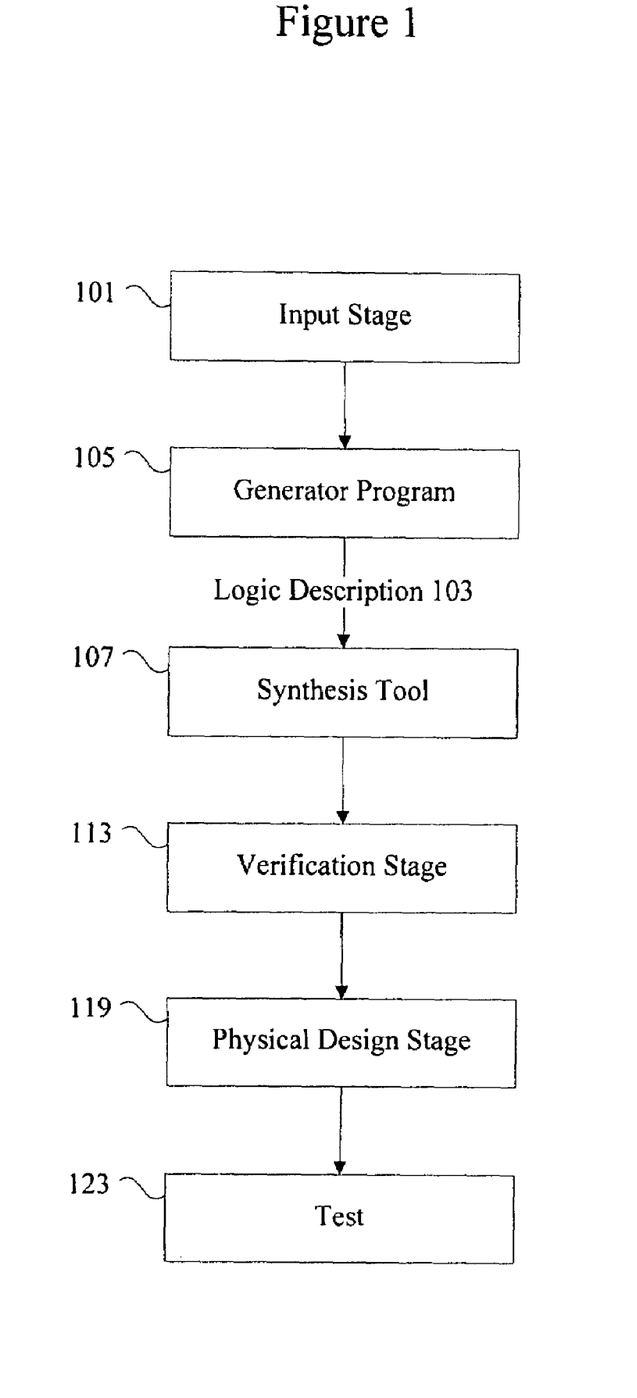
FIG. 1 is a diagrammatic representation showing a general implementation of an electronic device using various design automation tools that can be configured to operate with the mechanisms of the present invention.

FIG. 1 is a diagrammatic representation showing a general implementation of an electronic device using various design automation tools that can be configured to operate with the mechanisms of the present invention. An input stage 101 receives selection information typically from a user (e.g., designer) for logic such as a processor as well as other components to be implemented on an electronic device. A generator program 105 creates a logic description and provides the logic description along with other customized logic to any of a variety of synthesis tools, place and route programs, simulation tools, and logic configuration tools to allow a logic description to be implemented on an electronic device.

In one example, an input stage 101 often allows selection and parameterization of components to be used on an electronic device. In some examples, components provided to an input stage include intellectual property functions, megafunctions, and intellectual property cores. The input stage 101 may be a graphical user interface using wizards for allowing efficient or convenient entry of information. The input stage may also be a text interface or a program reading a data file such as a spreadsheet, database table, or schematic to acquire selection information. The input stage 101 produces an output containing information about the various modules selected.

In typical implementations, the generator program 105 can identify the selections and generate a logic description 103 with information for implementing the various modules. The generator program 105 can be a Perl script creating HDL files such as Verilog, Abel, VHDL, and AHDL files from the module information entered by a user. The generator program 105 can also provide information to a synthesis tool 107 to allow HDL files to be automatically synthesized. In some examples, a logic description is provided directly by a designer. Some of the available synthesis tools are Leonardo Spectrum, available from Mentor Graphics Corporation of Wilsonville, Ore. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 101, generator program 105, and synthesis tool 107 can be separate programs. The interface between the separate programs can be a database file, a log, or simply messages transmitted between the programs. For example, instead of writing a file to storage, the input stage 101 can send messages directly to the generator program 105 to allow the generator program to create a logic description. Similarly, the generator program can provide information directly to the synthesis tool or simulation tool instead of writing HDL files. Similarly, input stage 101, generator program 105, and synthesis tool 107 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 107.

A verification stage 113 typically follows the synthesis stage 107. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 113, the synthesized netlist file can be provided to physical design tools 119 including place and route and configuration tools. A place and route tool typically locates logic cells on specific logic elements of a target hardware device and connects wires between the inputs and outputs of the various logic elements in accordance with logic required to implement an electronic design. The device can also be physically tested at 123.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of simulation tools can be used to integrate the testbench according to various techniques of the present invention.

As noted above, different stages and programs can be integrated in a variety of manners. According to one embodiment, the input stage 101, the generator program 105, the synthesis tool 107, the verification tools 113, and physical design tools 119 are integrated into a single program. One such tool that integrates a variety of different stages is the SOPC Builder Tool, available from Altera Corporation of San Jose, Calif. The various stages are automatically run and transparent to a user. The program can receive the user selected modules, generate a logic description depicting logic for implementing or simulating the various selected modules, and implement the electronic device. As will be appreciated by one of skill in the art, HDL files and EDF files are mere examples of a logic description. Other file formats as well as internal program representations are other examples of a logic description.

Figure 2:
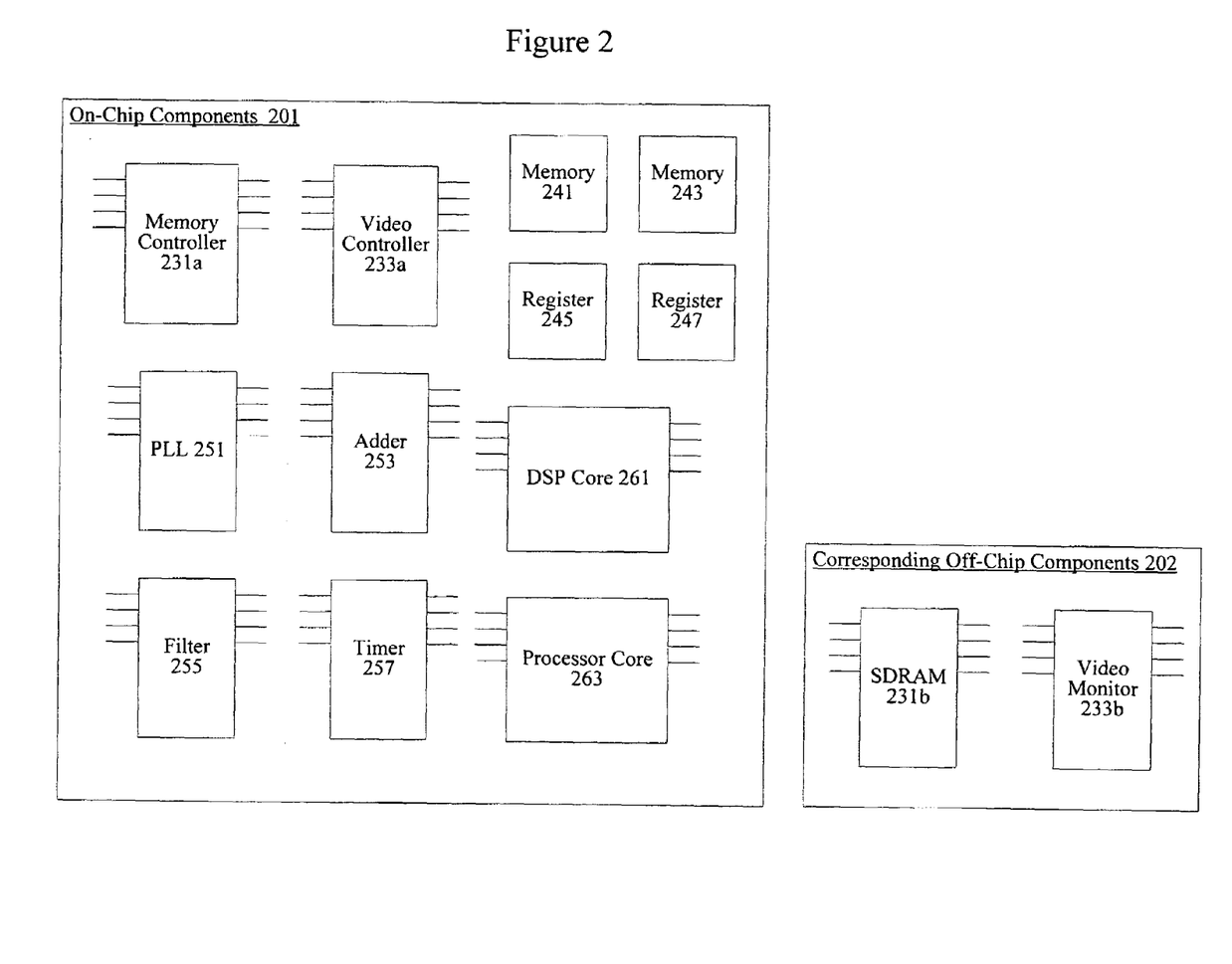
FIG. 2 is a diagrammatic representation showing an electronic device's design having a plurality of on-device components that interact with corresponding off-device components.

FIG. 2 is a diagrammatic representation showing one example of an electronic device's design having a plurality of on-device components 201 that interact with corresponding off-device components 202. An electronic device such as an ASIC, programmable chip, a system on a programmable chip, or system of chips, can be represented using various on-chip component modules. Possible on-chip component modules include memory controller module 231a, video controller module 233a, phase locked loop module 251, adder 253, filter 255, and timer 257. Other modules also include memory modules 241 and 243, registers 245 and 247, DSP core 261, processor core 263, etc. Each on-chip component module may also be associated with various input and output lines. The various input and output lines can be categorized into types such as clock lines, control lines, or data lines.

In a particular design, selected on-chip component modules interact with corresponding off-chip component modules. The corresponding off-chip component module may vary in type as well as in quantity based on the design application. For instance, memory controller module 231a may have a corresponding off-chip component module that includes only a SDRAM module 231b. Yet, video controller module 233a may have corresponding off-chip component that includes only a video monitor module 233b. Alternatively, processor core module 263 may have corresponding off-chip component modules that include SDRAM module 231b as well as video monitor module 233b. In any case, the corresponding off-chip component modules can be pre-determined for any on-device component module selected.

In many real world examples, the various input lines of the on-chip component modules would be interconnected with design functionality to allow performance of particular tasks. The techniques of the present invention further allow interconnectivity between the on-chip component modules and the off-chip test component modules in simulating real world conditions. A variety of different on-chip component modules can be selected for implementation as an electronic device. The various on-chip component modules can be interconnected to a variety of corresponding off-chip test component modules using techniques of the present invention.

Figure 3:
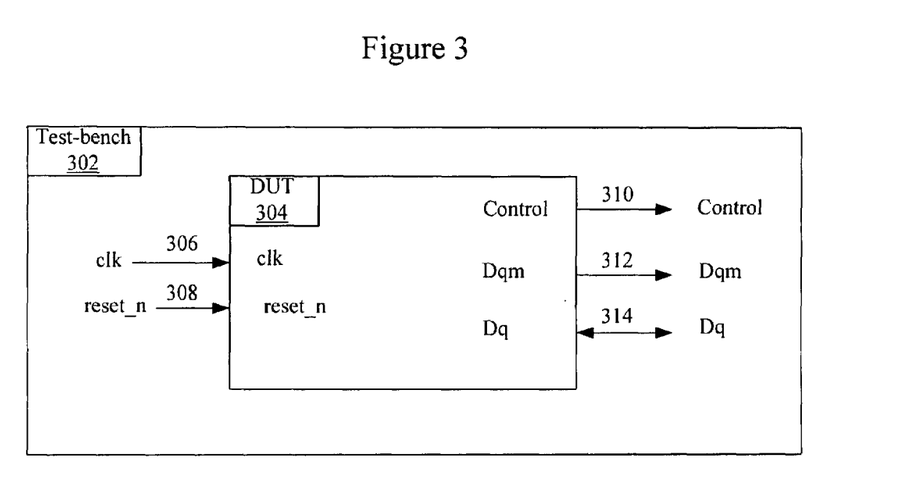
FIG. 3 is a diagrammatic representation showing a generated DUT module integrated with a simulation testbench.

FIG. 3 is a diagrammatic representation showing a generated DUT module 304 integrated with a simulation testbench 302. DUT module 304 may include any number of component modules selected for the design. Typically, DUT module 304 represents at least one on-device component for interaction with a corresponding off-device component. DUT module 304 may also include any number of inputs and outputs to effectuate testing of the DUT.

In one example, clock signal 306, reset signal 308, Control signal 310, Dqm signal 312, Data signal Dq 314 are coupled to DUT module 304. A clock generator and a reset generator respectively provide clock signal 306 and reset signal 308. In this example, Control signal 310, Dqm signal 312, and Data signal Dq 314 are available for connection to a corresponding off-device test component module. Conventionally, the off-device test component module is required to be manually installed.

Figure 4:
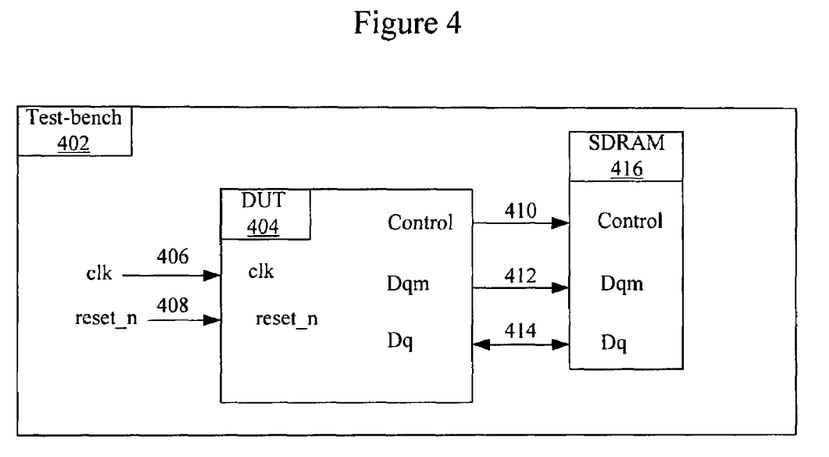
FIG. 4 is a diagrammatic representation showing both a generated DUT module and a generated off-device test component module integrated with a simulation testbench.

As an improvement to the simulation process, FIG. 4 is a diagrammatic representation showing both a generated DUT module 404 and a generated off-device test component module 416 integrated with a simulation testbench 402. Any conventional simulation tool as well as simulation testbench may be used to incorporate the present invention. In general, off-device test component module 416 is generated in response to a selected on-device component module represented by DUT module 404. The selection of the on-device component module is generally performed while the designer is inputting his design, for example, during input stage 101.

According to various embodiments of the present invention, DUT module 404 is provided for coupling to at least one corresponding off-device test component module 416. The coupling may be performed using a variety of techniques. For example, a top-level simulation module may be used to provide instructions on simulating and interconnecting DUT module 404 with off-device test component module 416. In one embodiment, the generated DUT module 404 and the generated off-device test component module 416 are automatically interconnected in accordance to the top-level simulation module such that the simulation of the DUT can be realized. In another example, logic is provided to align the inputs and outputs between DUT module 404 and off-device test component 416.

DUT module 404 and off-device test component module 416 may be generated from any format, such as the HDL files mentioned earlier from the generator program 105. In a specific embodiment, off-device test component module 416 is generated using the profile of DUT module 404 or its respective on-device component modules. As such, off-device test component module 416 can be generated to functionally complement DUT module 404. For instance, assuming DUT module 404 includes a representation of an on-device component such as memory controller 331*a* having a specified width and size, off-device test component module 416 can be generated to represent a SDRAM having at least in part a matching width and size. Therefore, off-device test component module 416 would be able to communicate and function appropriately with DUT module 404 to effectuate a proper simulation. In one embodiment, a corresponding off-device test component module 416 would be automatically generated and included in the simulation testbench while configured with matching parameters of an on-device component module represented by DUT module 404. In a specific embodiment, the on-device component module would necessarily interact with the corresponding off-device test component module.

DUT module 404 may also include any number or type of inputs and outputs to effectuate evaluation and testing of the DUT. As shown, inputs and outputs such as clock signal 406, reset signal 408, Control signal 410, Dqm signal 412, Data signal Dq 414 are coupled to DUT module 404. As before, a clock generator and a reset generator are used to respectively provide clock signal 406 and reset signal 408. In this example, Control signal 410, Dqm signal 412, and Data signal Dq 414 are available for connection to a corresponding off-device test component module. Similarly, off-device test component module 416 may also include any number or type of inputs and outputs. Generally, the number and type of inputs and outputs that the off-device component has will depend on the on-device component represented by the DUT module 404. Nevertheless, all the inputs and outputs between DUT module 404 and off-device test component module 416 can be connected automatically as described earlier.

Testbench 402 may perform a variety of functions. For example, testbench 402 may among other things be configured to instantiate the top level simulation module, instantiate the DUT module 404, instantiate and connect off-device test component module 416 to DUT module 404, drive clock and reset inputs with default behaviors, drive the interconnecting input and output signals between DUT module 404 and off-device test component module 416, and capture the responses of both DUT module 404 and off-device test component module 416. Furthermore, testbench 402 may control the reset generator and the clock generator.

In order to facilitate efficient testing of DUT module 404, off-device test component module 416 should be initially seeded. In some cases, the seeding is done automatically as the simulation begins. The seeding will typically include initial contents necessary to facilitate immediate testing of DUT module 404. For example, off-device test component module 416 can be initialized with contents read from an appropriately formatted file so that DUT module 404 can start accessing the data immediately, without having to go through the time consuming process of establishing the data into an empty off-device test component module.

Figure 5:
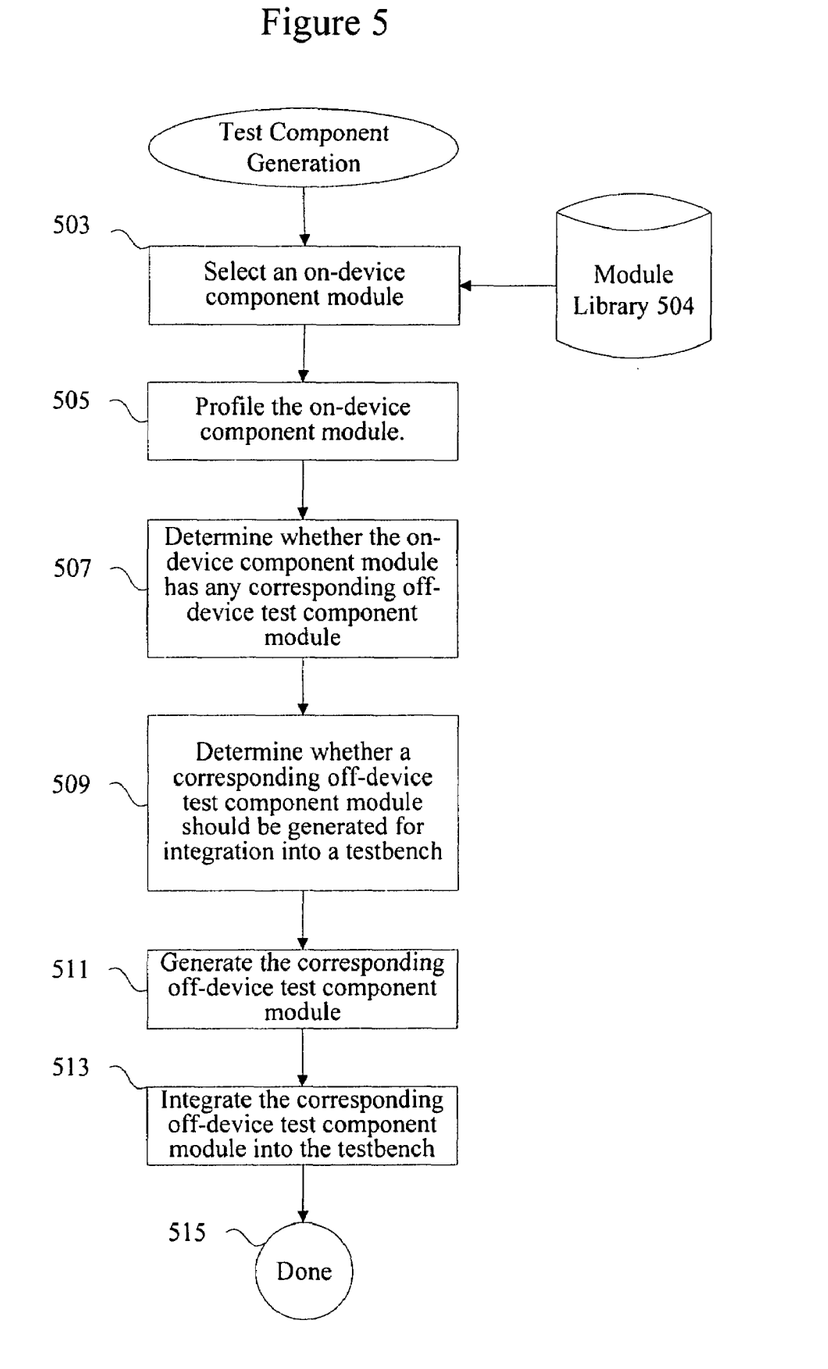
FIG. 5 is a process flow diagram showing a technique for automatic test component generation and inclusion into a simulation testbench.

FIG. 5 is a process flow diagram showing a technique for automatic test component generation and inclusion into a simulation testbench. The process flow will allow generation of a design testbench including automatically generated off-device test components based on the profiles of their on-device component counterparts. Any design being tested by the generated test component is referred to herein as the design under test (DUT). According to various embodiments, test component modules are generated and made readily available for inclusion into a simulation testbench, allowing in the simulation of "real world" conditions. The DUT can include user supplied design HDL modules as well as generic modules.

A user may no longer have to specify, find, or create specific off-chip test components. Instead, the user now can simply enter on-device component modules and the techniques of the present invention can automatically generate a functionally complementary and meaningful set of corresponding off-device test component modules. According to various embodiments, a user simply enters the on-chip component modules, which may be based on a list of hardware families or classes from which a design family will be chosen. The user can also enter basic on-chip component parameters, such as general size or I/O structure. The off-device test component module can then be generated concurrently or sequentially to the entering of the on-chip component modules. The following is a more detailed description of the process of generating single as well as multiple off-chip test component modules.

At 503, selection of an on-device component module is performed. This may involve various on-device components such as processors, microcontroller peripherals, DSP cores, IP cores, communication peripherals, interfaces, software components, bridges, etc. The on-device components are generally used to define the design to implement into an electronic device. The on-device component modules may be selected from a module library 504 within the EDA tool or elsewhere, such as from an external file from a vendor. The selection may be based on a particular component type or use sought for the design.

Each on-device component will typically have an associated profile. If not, the step of initially profiling or further profiling the on-device component module may be done in 505. This involves parameterizing the on-device component module to suit the design for implementation. Depending on the on-device component module, parameterizing may include specifying the address ranges, interrupt numbers, interfaces, data widths, size, clocks, and the type of signal for inputs and outputs, etc.

After an on-device component module has been selected, the determination of whether the on-device component module has any corresponding off-device component module to possibly interact with is performed in 507. The determination may be done in many ways. For instance, the designer may be prompted to identify any possible off-device component modules that would be interacting with the on-device component module. In a preferred embodiment, any corresponding off-device component module would be already identified based on the selected on-device component module.

Next, determination of whether a corresponding off-device test component module should be generated for integration into a testbench is performed in 509. Here, a selection is made on which corresponding off-device test component to generate. The selection may be made from those identified in operation 507. Moreover, the selection may be made by the designer or pre-selected by default. Any number of off-device test components may also be selected.

If it is determined that a corresponding off-device test component module should be generated for integration into a testbench, the generation of the off-device test component module can be performed in 511. The generation of the off-device test component module can include any number of files in any format that is necessary for proper integration into the testbench. In generating the off-device test component module, information regarding the corresponding on-device component module would be received. The information would generally be a profile used to define the corresponding on-device component. The profile can then be used together with an off-device component module selected from module library 504 in generating the corresponding off-device component module. In a preferred embodiment, the profile provides information on how the on-device component would interact with the corresponding off-device component. As such, the corresponding off-device test component module would functionally complement the selected on-device component module.

Integration of the off-device test component module into the testbench is next performed in 513. Here, the testbench is generated with the off-device test component module. In general, this also includes generation of a DUT module containing the selected on-device component module as well as interconnection of the DUT module with the off-device test component module. At this point, simulation of the DUT module and off-device test component module can properly begin. Seeding of the off-device test component with initial contents may automatically and simultaneously occur upon simulation. As mentioned earlier, any number of conventional simulation tools embodying the present invention may be used to facilitate evaluation and testing of the DUT along with its associated components. Finally, the process flow diagrams ends at 515.

It should be noted that any of the operations in the process flow diagram of FIG. 5 may be performed automatically after performing operation 503. Furthermore, some operations may be omitted or repeated. In one example, operation 505 can be omitted if the selected on-device component module already has an associated profile. In another example, operations 503 through 513 may be repeated in part or in all to allow multiple test components to be generated. Moreover, a testbench generator may perform any of the operations 507 through 513 in the process flow diagram. As such, an efficient and cost effective solution is provided for testing and evaluating a design under test having on-device components that interact with off-device components.

Figure 6:
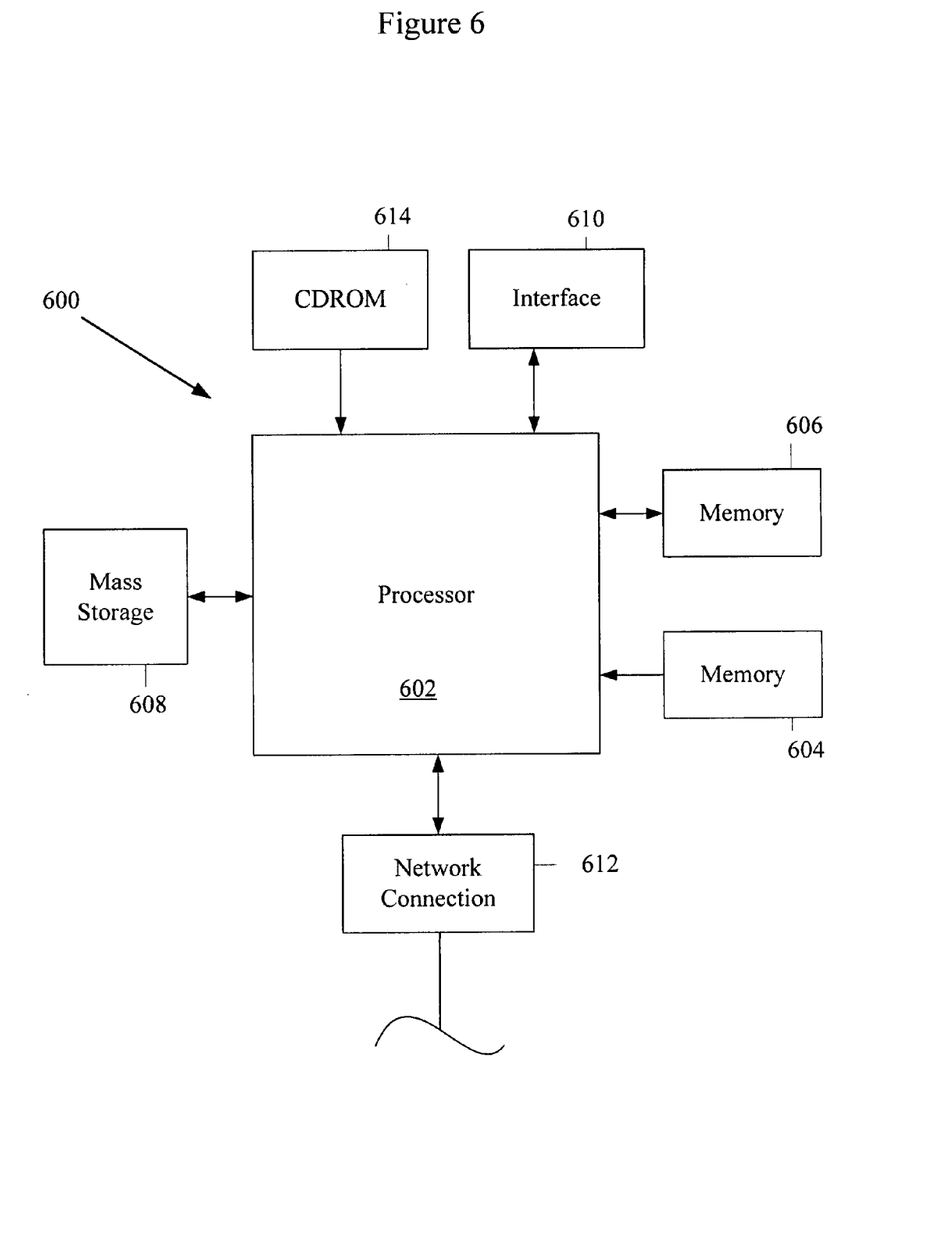
FIG. 6 is a diagrammatic representation of a computer system that can be used to implement test component generation and inclusion into a simulation testbench.

FIG. 6 illustrates a typical computer system that can be used to implement a programmable chip in accordance with an embodiment of the present invention. The computer system 600 includes any number of processors 602 (also referred to as central processing units, or CPUs) that are coupled to devices including memory 606 (typically a random access memory, or "RAM"), memory 604 (typically a read only memory, or "ROM"). The processors 602 can be configured to generate a testbench/test component for a particular DUT. As is well known in the art, memory 604 acts to transfer data and instructions uni-directionally to the CPU and memory 606 is used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory 606 as virtual memory. A specific mass storage device such as a CD-ROM 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Video monitors can be used to display wizards and subwizards to a user. Finally, CPU 602 optionally may be coupled to a computer or telecommunications network using a network connection as shown generally at 612. With such a network connection, it is contemplated that the CPU might receive information from the network, or might output information to the network in the course of performing the above-described method steps. It should be noted that the system 600 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 608 or 614 and executed on CPU 608 in conjunction with primary memory 606.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, various aspects described above may be implemented using firmware, software, or hardware. Aspects of the present invention may be employed with a variety of different file formats, languages, and communication protocols and should not be restricted to the ones mentioned above. In one example, the techniques of the present invention could be applied to any design under test for any device. This may include designs with multiple masters, slaves, and arbitration logic. Therefore, the scope of the invention should be determined with reference to the appended claims.

We claim:

1. A computerized method for evaluating a device's design under test having an on-device component, the method comprising:

selecting an on-device component for inclusion in the design under test;

profiling the on-device component;

automatically generating a hardware descriptor language file corresponding to a test component module that includes a representation of an off-device component, the hardware descriptor language file generated using profile information about the on-device component, the off-device component being functionally complementary to that of the on-device component; and inserting the test component module into a simulation testbench for evaluating the device's design under test.

2. The computerized method of claim 1, further comprising:

generating a design under test module that includes a representation of the on-device component; and coupling the design under test module to the test component module.

3. The computerized method of claim 2, further comprising:

generating signals between the design under test module and the test component module to allow substantial evaluation of the device's design under test.

4. The computerized method of claim 2, further comprising:

seeding the test component module with initial contents.

5. The computerized method of claim 2, wherein generating the design under test module comprises:

receiving a profile for the design under test; and using the profile to construct the design under test module.

6. The computerized method of claim 5, wherein the profile corresponds to a parameterization of the design under test by a user.

7. The computerized method of claim 6, wherein the parameterization comprises:

defining interfaces, data widths, and the type of signal for input and output lines associated with the design under test.

8. The computerized method of claim 1, wherein generating the test component module comprises:

receiving a profile for the design under test; and using the profile to construct the test component module.

9. The computerized method of claim 1, wherein the on-device component is selected from the group consisting of adders, phase lock loops, memory, video controllers, memory controllers, processors, and timers.

10. A system for evaluating a device's design under test having an on-device component, the system comprising:

means for selecting an on-device component for inclusion in the design under test;

means for profiling the on-device component;

means for automatically generating a hardware descriptor language file corresponding to a test component module that includes a representation of an off-device component, the hardware descriptor language file generated using profile information about the on-device component, the off-device component being functionally complementary to that of the on-device component; and means for inserting the test component module into a simulation testbench for evaluating the device's design under test.

* * * * *